United States Patent [19]
Sadowski

[11] Patent Number: 6,016,069
[45] Date of Patent: Jan. 18, 2000

[54] ATTENUATING SYSTEMS AND METHODS FOR ACQUIRING SYNCHRONIZATION IN PHASE LOCKED LOOPS

[75] Inventor: Bogdan Sadowski, Apex, N.C.

[73] Assignee: Ericsson Inc., Research Triangle Park, N.C.

[21] Appl. No.: 09/021,668

[22] Filed: Feb. 10, 1998

[51] Int. Cl.⁷ .............................. H03L 7/00; H03L 7/093
[52] U.S. Cl. .............................. 327/156; 327/308; 331/4; 331/17; 375/373
[58] Field of Search ..................................... 327/105, 113, 327/114, 155, 156, 159, 2, 3, 5, 7, 308, 306, 147, 146, 149, 158; 375/373, 375, 376; 331/4, 17, 15, 25

[56] References Cited

U.S. PATENT DOCUMENTS

| | | | |
|---|---|---|---|
| 5,498,998 | 3/1996 | Gehrke et al. .............................. | 331/17 |
| 5,651,035 | 7/1997 | Tozun et al. .............................. | 375/373 |

OTHER PUBLICATIONS

Kroupa, *"Frequency Synthesis—Theory, Design & Applications"*, John Wiley & Sons, 1973, pp. 171–176.

Gardner, *"Phaselock Techniques, Second Edition"*, John Wiley & Sons, 1979, pp. 53–91.

*Primary Examiner*—Timothy P. Callahan
*Assistant Examiner*—Eunja Adolphe
*Attorney, Agent, or Firm*—Myers Bigel Sibley & Sajovec

[57] ABSTRACT

A phase locked loop includes a controlled oscillator that is responsive to a control signal to generate an output signal, the frequency of which is a function of the control signal. A phase detector is responsive to a reference frequency input signal and to the output signal, to produce an error signal. A loop filter filters the error signal, to thereby produce the control signal. An acquisition sweep circuit is responsive to an activation signal, to sweep the control signal and thereby aid to acquire lock in the phase locked loop. Simultaneous increase in the amplitude of the reference frequency input signal is provided during sweep of the control signal. The increase in amplitude may be provided by a variable attenuation circuit that is coupled between a phase locked loop input signal and the reference frequency input signal, and that is also responsive to the activation signal. The variable attenuation circuit, preferably in the form of a tunable resonant tank notch circuit, attenuates the phase locked loop input signal after the sweep of the control signal, to thereby decrease the amplitude of the reference frequency input signal after the sweep of the control signal. Thus, the amplitude of the reference frequency input signal is higher during the sweep of the control signal, to thereby temporarily widen the bandwidth of the phase locked loop, while temporarily sweeping the control signal.

19 Claims, 4 Drawing Sheets

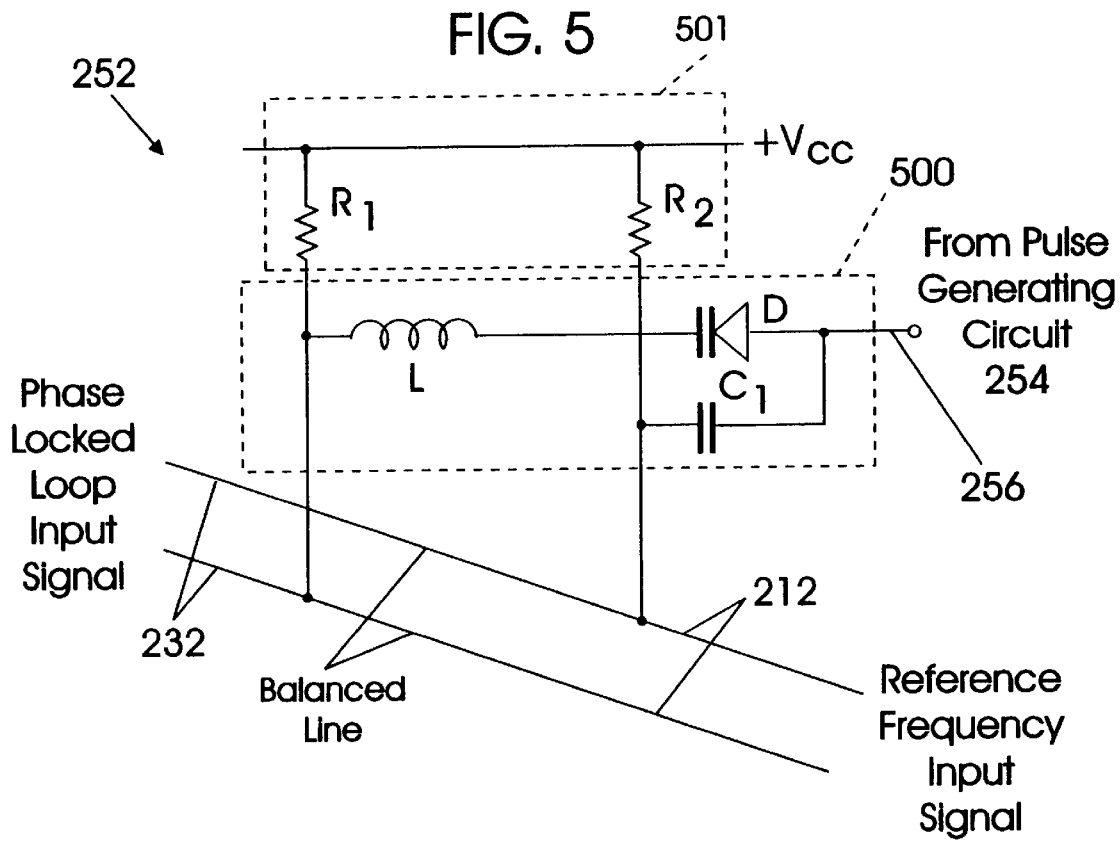
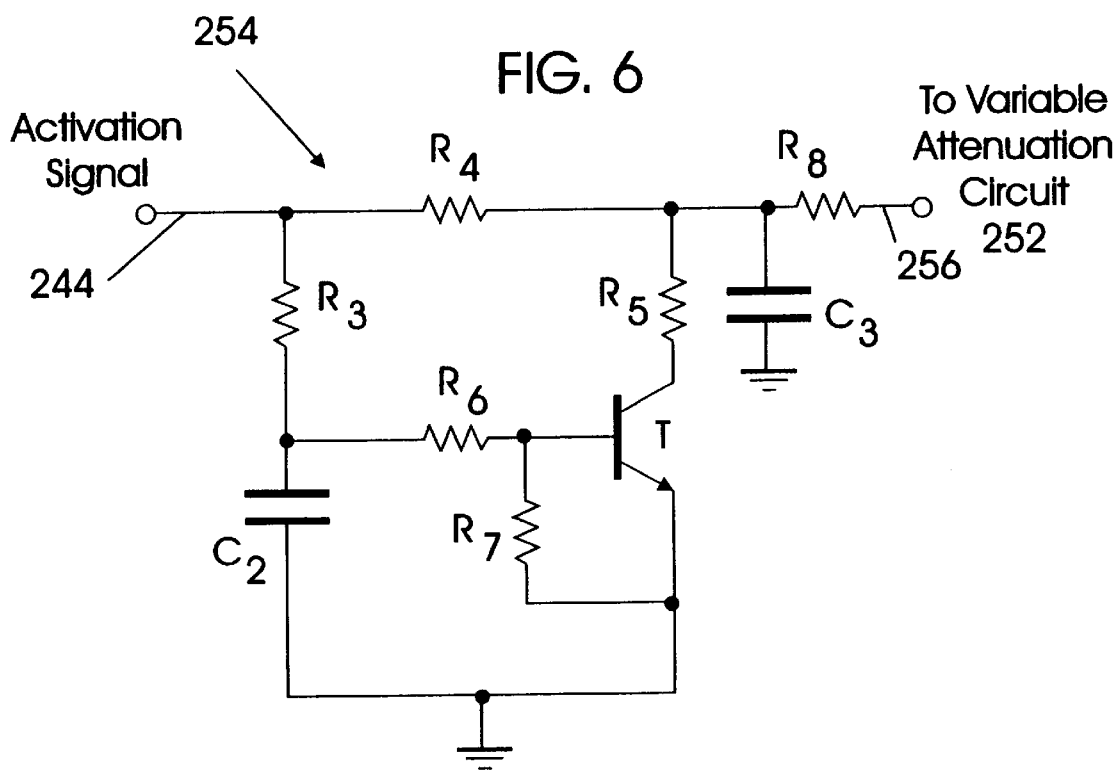

ATTENUATING SYSTEMS AND METHODS FOR ACQUIRING SYNCHRONIZATION IN PHASE LOCKED LOOPS

FIELD OF THE INVENTION

This invention relates to electronic circuits, and more particularly to phase locked loops.

BACKGROUND OF THE INVENTION

Phase locked loops are widely used in electronic systems. For example, phase locked loops are widely used in communication systems including but not limited to radio frequency communications systems such as radiotelephones. FIG. 1 is a block diagram illustrating a conventional phase locked loop.

Referring now to FIG. 1, a conventional phase locked loop 100 includes a controlled oscillator 102 such as a voltage controlled oscillator (VCO) that is responsive to a control signal 104, to generate an output signal 106, the frequency of which is a function of control signal. A sinusoidal phase detector 108, also referred to as a multiplier, is responsive to a reference frequency input signal 112 and to the feedback signal 106' to produce an error signal 114. A loop filter 116 filters the error signal 114, to thereby produce the control signal 104 that is provided to the voltage controlled oscillator 102. The loop filter is designed to provide stability at the phase locked loop. Feedback signal 106' is coupled from the VCO output directly or via frequency converter 120 that is responsive to the output signal 106 and to the offset frequency signal 118. The output of the frequency converter may be filtered by a bandpass filter 122. When a frequency converter is used, the phase detector 108 is responsive to the frequency of the output signal 106 as offset by the frequency of the offset frequency signal 118. The design and operation of the phase locked loop 100 and the individual components thereof are well known to those having skill in the art and need not be described further herein.

One of the major concerns in the design and operation of phase locked loops is the rapid acquisition of phase lock. It will be understood that phase lock is generally acquired when the electronic system including the phase locked loop is activated. Phase lock is also generally reacquired when the system is retuned to another channel. In high performance electronic systems, the time allocated for acquisition may not be long enough to establish the phase lock state in the phase locked loop. Moreover, sometimes acquisition may not take place at all if the frequency of the input signal is outside the pull-in range of the phase locked loop. Accordingly, it is known to provide phase locked loop acquisition circuits to decrease the acquisition time for the phase locked loop.

The phase locked loop 100 of FIG. 1 includes a conventional acquisition sweep circuit 140. The acquisition sweep circuit is responsive to an activation signal 144, that is activated upon operation or retuning of the phase locked loop. In response to the activation signal 144, the acquisition sweep circuit 140 produces an acquisition sweep voltage or current 142 that generally is a monotonic function of time. The acquisition voltage or current 142 is added to the error signal 114 using summer 146, to thereby sweep the control signal 104 and thereby acquire lock in the phase locked loop. It will also be understood that although the summer 146 is shown between the phase detector 108 and loop filter 116, the summer 146 may also be placed between the loop filter 116 and the controlled oscillator 102 to sweep the control signal 104. A discussion of phase locked loop acquisition and acquisition sweep circuits may be found at pages 53–91 of "*Phaselock Techniques*" by F. M. Gardner, John Wiley & Sons, 1979, the disclosure of which is hereby incorporated herein by reference.

Unfortunately, there may be limitations on how rapidly the acquisition sweep voltage or current 142 may sweep. In particular, as described in the aforesaid Gardner reference, it is desired that the rate of change of the output frequency should not exceed $\omega_n^2$, where $\omega_n$ is the natural loop frequency of the phase locked loop, in view of the sinusoidal characteristic of the phase detector 108. Moreover, it is recommended that the rate of change at the controlled oscillator frequency should be kept below $\omega_n^2/2$. Thus, for a high probability of lock during a single acquisition sweep, the rate of change of the frequency of the controlled oscillator 102 should be less than half the square of the natural loop frequency of the phase locked loop. This can enhance the probability of acquiring phase lock, but will also increase the amount of time it takes to sweep acquisition sweep voltage or current 142 for given sweep range.

In order to allow a higher sweep rate, it is known to raise the natural loop frequency of the phase locked loop by increasing the bandwidth thereof. For example, it is known to increase the bandwidth of the phase locked loop during acquisition by providing a switchable loop filter 116 that can have a higher bandwidth during acquisition and a lower bandwidth after acquisition. Unfortunately, a switchable loop filter may introduce a switching transient in response to which the phase locked loop may lose synchronization if the switching transient is an abrupt function of time. Noise, particularly that of 1/f type, may also be introduced into the phase locked loop which can degrade the performance thereof.

It is also known to add automatic frequency and phase control circuits to assist in the acquisition of phase lock. However, these circuits may add undue complexity to the phase locked loop.

SUMMARY OF THE INVENTION

It is therefore an object of the present invention to provide improved acquisition circuits and methods for phase locked loops.

It is another object of the present invention to provide phase locked loop acquisition circuits and methods that need not add noise or impact performance of the phase locked loop after acquisition has been completed.

These and other objects are provided, according to the present invention, by temporarily increasing the amplitude of the reference frequency input signal at the same time the control signal is swept to acquire lock in the phase locked loop, to thereby temporarily widen the bandwidth of the phase locked loop while temporarily sweeping the control signal. Accordingly, the bandwidth of the phase locked loop can be increased during acquisition without requiring switchable filters or other noise generating circuits in the loop. Rather, the amplitude of the reference frequency input signal is temporarily increased by means outside of the phase locked loop, to thereby temporarily widen the bandwidth of the phase locked loop during acquisition.

More specifically, phase locked loops according to the invention include a controlled oscillator that is responsive to a control signal to generate an output signal. A phase detector is responsive to a reference frequency input signal and to the output signal, to produce an error signal. A loop filter filters the error signal, to thereby produce the control signal and provide stability of the loop. An acquisition sweep circuit is responsive to an activation signal, to sweep the control signal and thereby acquire lock in the phase locked loop. An increase in the amplitude of the reference frequency signal during acquisition sweep may be provided by a variable attenuation circuit, responsive to the activation signal, that is coupled between a phase locked loop input signal and the reference frequency input signal. The variable attenuation circuit attenuates the phase locked loop input signal after the sweep of the control signal is performed and lock condition is established. Thus, the amplitude of the phase locked loop reference frequency input signal is higher during the sweep of the control signal, to thereby temporarily widen the bandwidth of the phase locked loop, while temporarily sweeping the control signal. Alternatively, the variable attenuation circuit may provide some attenuation or may provide amplification, to the reference frequency input signal during the sweep of the control signal, and provide more attenuation or less amplification respectively, to the reference frequency input signal after the sweep of the control signal is performed and lock condition is established.

The variable attenuation circuit may be controlled by a pulse generating circuit that is responsive to the activation signal, to generate a pulse in response to the activation signal. In this case, the variable attenuation circuit is responsive to the voltage levels of the pulse during sweep of the control voltage and after sweep is performed, and attenuation is adjusted corresponding to those levels. Preferably, the variable attenuation circuit comprises a resonant tank notch circuit that is free of resistive components that could add thermal noise.

Methods for acquiring lock in a phase locked loop according to the invention include the steps of temporarily sweeping the control signal and simultaneously temporarily increasing the amplitude of the reference frequency input signal, to thereby temporarily widen the bandwidth of the phase locked loop while temporarily sweeping the control signal. While temporarily sweeping the control signal, the phase locked loop input signal may be attenuated, by less than when the sweep of the control signal has been completed and lock condition has been established. For example, a first attenuation may be provided to the phase locked loop input signal while temporarily sweeping the control signal, and a second attenuation greater than the first attenuation may be provided to the phase locked loop input signal after temporarily sweeping the control signal. Alternatively, no attenuation may be provided to the phase locked loop input signal while temporarily sweeping the control signal, and the phase locked loop input signal may be attenuated after temporarily sweeping the control signal. Accordingly, the bandwidth of the loop may be widened during acquisition, to thereby decrease the acquisition time, without requiring introduction of switching circuits or other noise sources into the phase locked loop. Since the frequency of the phase locked loop input signal generally is much higher than that of the error signal, the impact of the 1/f noise generated in the variable attenuation circuit on the phase locked loop performance may be reduced. Furthermore, the variable attenuation circuit may be built using only reactive components to further reduce impact on the phase locked loop noise performance.

BRIEF DESCRIPTION OF THE DRAWINGS

FIG. 5 is a circuit diagram of a variable attenuator of FIG. 2.

FIG. 6 is a circuit diagram of a pulse generating circuit of FIG. 2.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
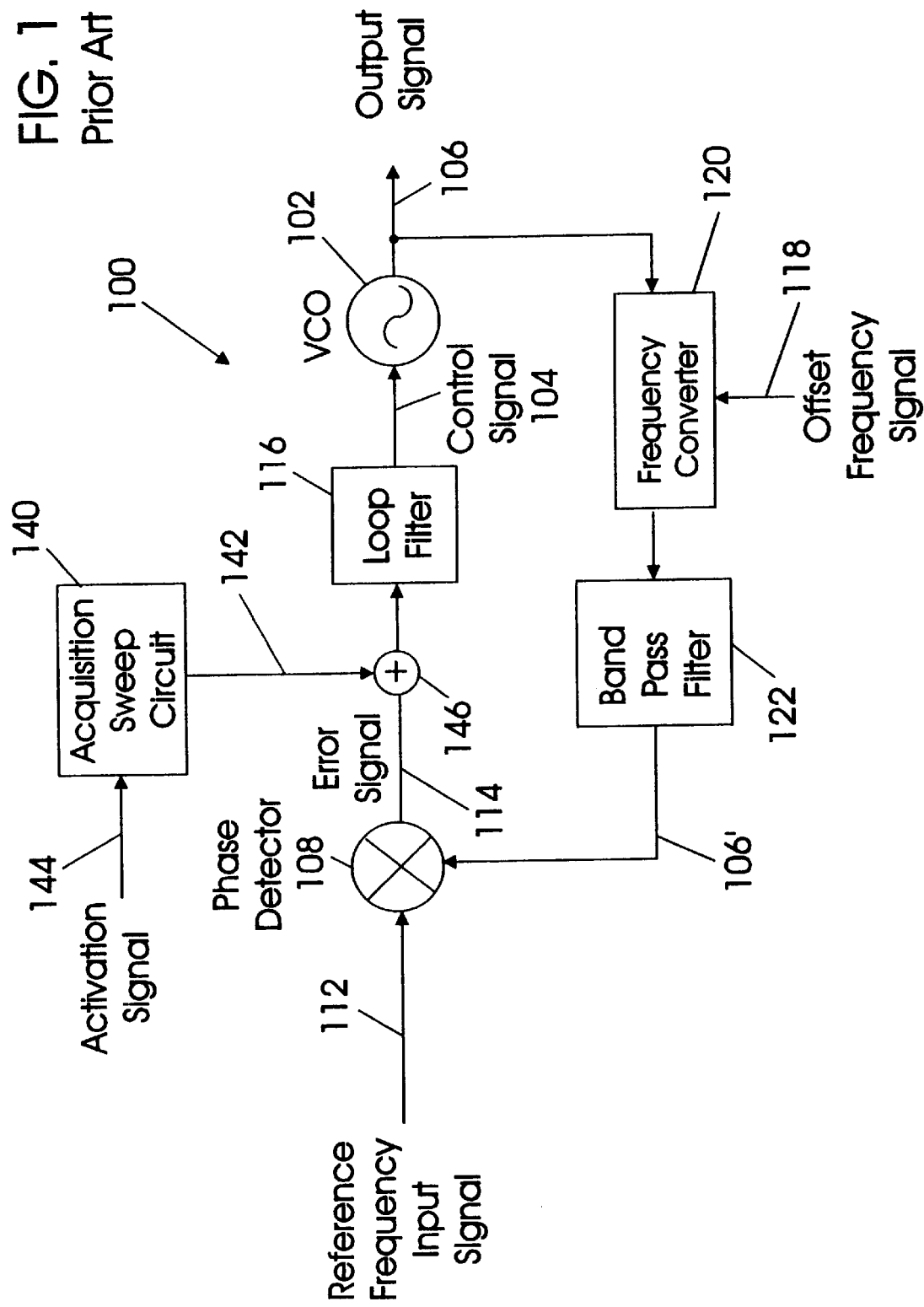
FIG. 1 is a block diagram of conventional phase locked loops.
Figure 2:
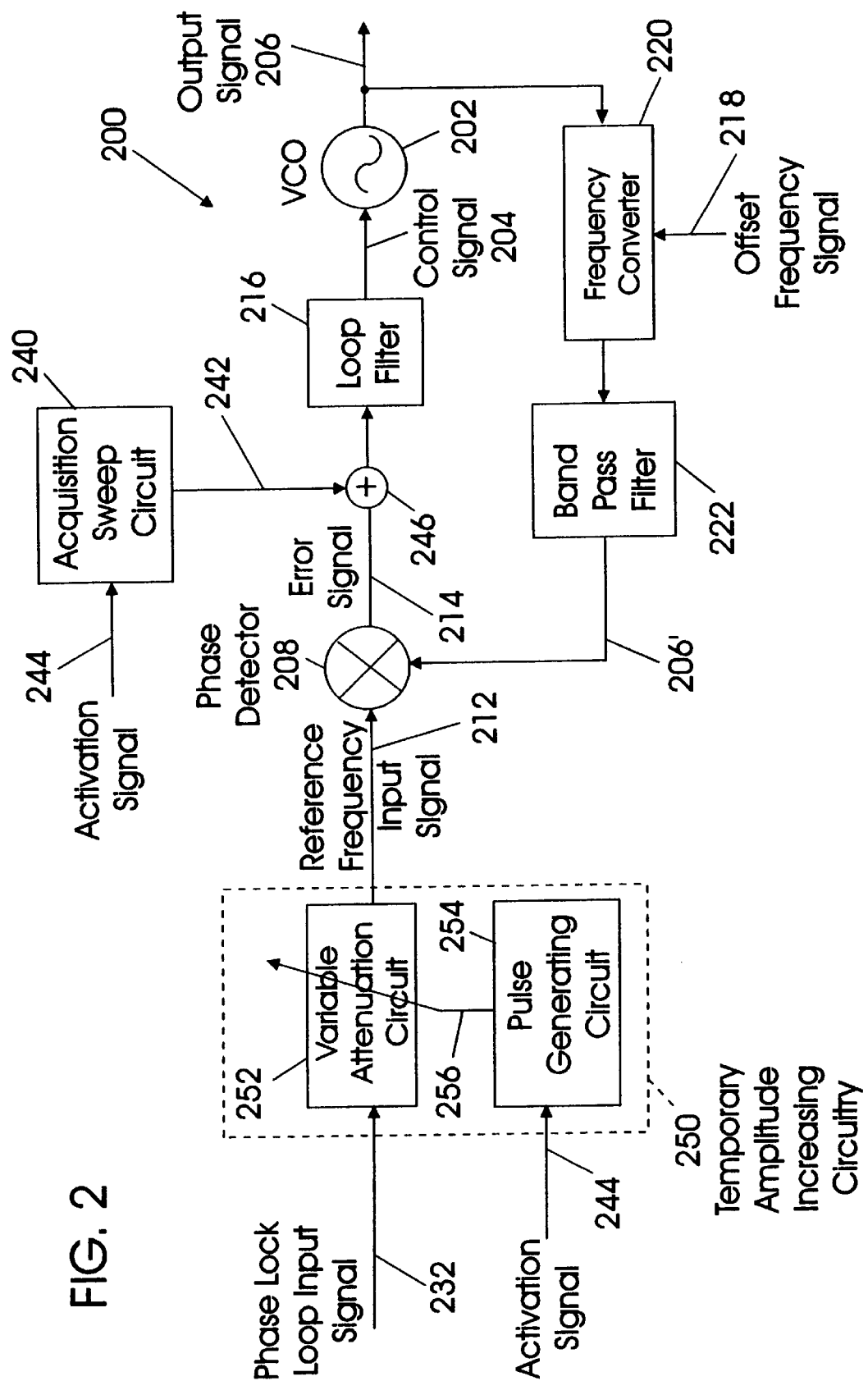
FIG. 2 is a block diagram of phase locked loops according to the present invention.

Referring now to FIG. 2, a block diagram of phase locked loops according to the present invention will now be described. Phase locked loops 200 according to the invention include a controlled oscillator 202 such as a voltage controlled oscillator (VCO) that is responsive to control signal 204, to generate an output signal 206, the frequency of which is a function of control signal 204. A phase detector 208, also referred to as a multiplier, is responsive to a reference frequency input signal 212 and to the output signal 206 to produce an error signal 214. A loop filter 216 filters the error signal 214, to thereby produce the control signal 204 that is provided to the voltage controlled oscillator 202. Loop filter 216 is designed to provide loop stability. The phase locked loop may also be responsive to an offset frequency signal 218 using a frequency converter 220 that is responsive to the output signal 206 and to the offset frequency signal 218. The output of the frequency converter may be filtered by a bandpass filter 222. When an offset frequency is used, the phase detector 208 is responsive to the signal indicated by 206' in FIG. 2, the frequency of which is offset from the frequency of the output signal 206 by the frequency of the offset frequency signal 218. The design and operation of phase locked loop 200, as described above, and the individual components described above, are well known to those having skill in the art and need not be described further herein.

The phase locked loop 200 of FIG. 2 also includes a conventional acquisition sweep circuit 240. The acquisition sweep circuit is responsive to an activation signal 244, that is activated upon operation or retuning of the phase locked loop. In response to the activation signal 244, the acquisition sweep circuit 240 produces an acquisition sweep voltage or current 242 that generally is a monotonic function of time. The acquisition voltage or current 242 is added to the error signal 214 using summer 246, to thereby sweep the control signal 204, to thereby acquire lock in the phase locked loop. It will also be understood that although the summer 246 is shown between the phase detector 208 and loop filter 216, the summer 246 may also be placed between the loop filter 216 and the controlled oscillator 202 to sweep the control signal 204.

Still referring to FIG. 2, phase locked loops 200 according to the present invention also include temporary amplitude increasing circuitry 250 for simultaneously temporarily increasing the amplitude of the reference frequency input signal 212, to thereby widen the bandwidth of the phase locked loop while temporarily sweeping the control signal 204. As shown in FIG. 2, temporary amplitude increasing circuit 250 includes a variable attenuation circuit 252 that is coupled between a phase locked loop input signal 232 and the reference frequency input signal 212, and that is also responsive to the pulse control signal 256, to attenuate the phase locked loop input signal 232 by less during sweep of the control signal 204 and by more after the sweep of the control signal 204 has been completed. Thus, the variable attenuation circuit 252 temporarily increases the amplitude of the reference frequency input signal 212 during temporary sweeping of the control signal 204. The gain of the phase detector, being implemented as a linear multiplier, increases when the reference frequency input signal increases and thereby the bandwidth of the phase locked loop 200 increases while sweeping the control signal 204.

The temporary amplitude increasing circuit 250 also includes a pulse generating circuit 254 that is responsive to the activation signal 244, to generate a pulse control signal 256 in response to the activation signal. The variable attenuation circuit 252 is responsive to the pulse control signal 256.

Figure 3:
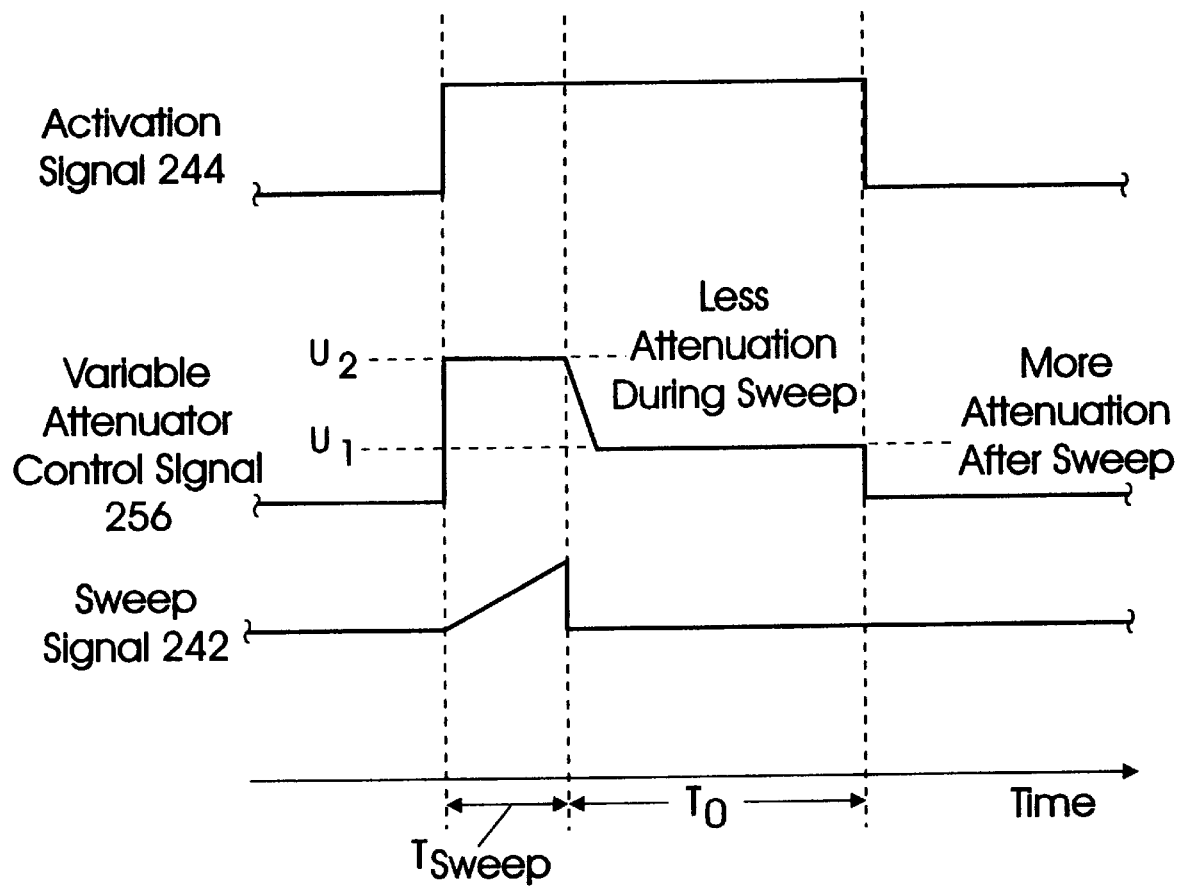
FIG. 3 is a timing diagram illustrating operation of variable attenuation circuits and methods according to the present invention.

Accordingly, as shown in FIG. 3, attenuation is controlled by the pulse generating circuit 254 and is triggered by the activation signal 244. When the activation signal goes high, acquisition mode starts. The acquisition sweep circuit 240 is activated to generate a sweep current or voltage 242 and the control signal 204 of the controlled oscillator 202 is swept for a period of time $T_{SWEEP}$. The pulse control signal 256 sets attenuation of the variable attenuation circuit 252 to a minimum value. After time $T_{SWEEP}$ has concluded, attenuation is increased gradually to avoid abrupt switching transients while changing the attenuation amount, and the acquisition sweep circuit 240 is deactivated. After the time To has ended, the activation signal 244 becomes low and the temporary amplitude increasing circuitry 250 become inactive until reactivated.

Figure 4:
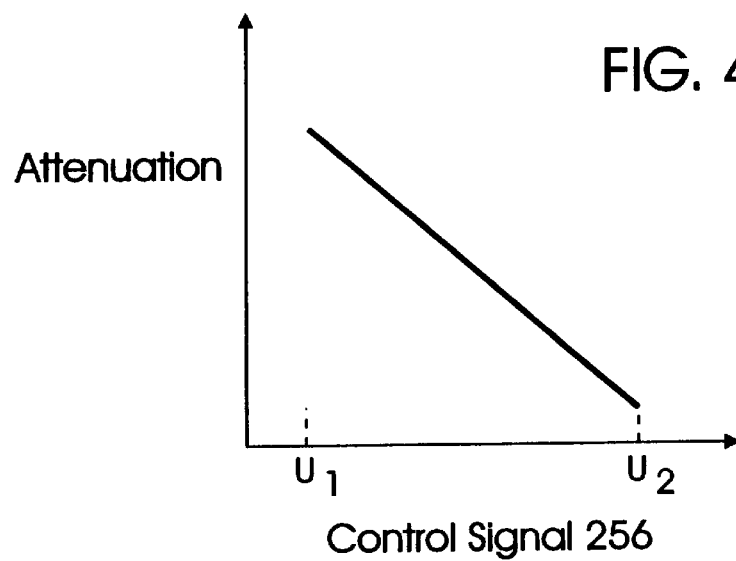
FIG. 4 graphically illustrates the transfer characteristics of a variable attenuation circuit of FIG. 2.

The variable attenuation circuit 252 is preferably a linear variable attenuator that has a transfer characteristic as shown in FIG. 4. However, it will be understood that a nonlinear attenuator may also be used as long as the attenuation sustains a monotonic function of the pulse control signal 256. The variable attenuation circuit 252 may attenuate the phase locked loop input signal 232 after the sweep of the control signal by acquisition sweep circuit 240 has been completed, to thereby lower the amplitude of the reference frequency input signal 212 after the sweep of the control signal 204. The variable attenuation circuit may attenuate the phase locked loop input signal 232 by varying amounts of attenuation during acquisition sweep and after acquisition sweep has been completed. More specifically, the variable attenuator may provide a first attenuation to the phase locked loop input signal 232 during the sweep of the control signal 204 and may provide a second attenuation greater than the first attenuation to the phase locked loop input signal 232 after the sweep of the control signal 204 has been completed. Alternatively, the variable attenuation circuit 252 may provide amplification or no attenuation to the phase locked loop input signal 232 during the sweep of the control signal 204 by acquisition sweep circuit 240, and can provide less amplification or some attenuation, respectively, to the phase locked loop input signal after the sweep of the control signal 204 has been completed.

The design of each of the individual blocks of temporary amplitude increasing circuit 250, i.e. the variable attenuation circuit 252 and the pulse generating circuit 254, are well known to those having skill in the art. Preferred embodiments of each of these blocks will now be described. It will be understood that other conventional designs may be used.

FIG. 5 illustrates a preferred embodiment of a variable attenuation circuit 252. It will be understood by those having skill in the art that the variable attenuation circuit may be implemented by a variable resistive attenuator. However, in order to reduce the number of noise sources within the variable attenuation circuit, the attenuator built from reactive components is preferred. Accordingly, in a preferred aspect of the present invention, the variable attenuation circuit 252 is implemented using a resonant tank notch circuit 500. The variable attenuation circuit 252 of FIG. 5 may be used with a balanced phase locked loop input signal 232 to generate a balanced reference frequency input signal 212. The balanced signal lines may use a bias circuit 501, which includes for example, a pair of resistors $R_1$ and $R_2$ between a power supply line Vcc and the balanced lines. The tank circuit 500 includes an inductor L, a varactor or variable capacitance diode D and a capacitor $C_1$. The tank circuit is tuned using the pulse control signal 256 from pulse generating circuit 254.

FIG. 6 illustrates an embodiment of a pulse generating circuit 254. It will be understood by those having skill in the art that other conventional pulse generating circuits may be employed. In response to activation signal 244, pulse generating circuit 254 generates a pulse control signal 256 of the shape as shown in FIG. 3. As shown in FIG. 6, bipolar transistor T operates as a saturated switch. When the activation signal 244 goes high, pulse control signal 256 goes high and capacitor $C_2$ is charged via resistor $R_3$. Transistor T is initially turned off. After the voltage on the capacitor $C_2$ reaches the threshold, transistor T turns on and goes into saturation, thereby activating the voltage divider formed by resistors $R_4$ and $R_5$ which effectively lowers the voltage level of the pulse control signal. This results in an increase of attenuation of the variable attenuation circuit 252. When activation signal 244 goes low, pulse control signal goes low and capacitor $C_2$ is discharged. Resistor $R_8$ and capacitor $C_3$ are used to decouple the reference frequency input signal from the pulse control signal Accordingly, the bandwidth of the phase locked loop is controlled using a variable attenuation circuit that is external to the loop. All the loop components may be fixed, which can improve the performance of the phase locked loop and simplify the design. The present invention does not require a switchable loop filter or an adjustable gain error signal amplifier in the loop. A switchable loop filter or an adjustable gain error signal amplifier can improve the acquisition time, but at the potential expense of addition of new 1/f noise sources in the loop which can affect the noise performance of the loop. In contrast, the present invention can improve the acquisition without the need to add new 1/f noise sources to the loop. By separately setting the gain of the phase detector during acquisition and during locked condition, optimization of the loop parameters for the locked condition may be obtained, without the need to compromise between loop parameters during acquisition and during locked condition.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A phase locked loop comprising:

a controlled oscillator that is responsive to a control signal to generate an output signal;

a phase detector that is responsive to a reference frequency input signal and to the output signal to produce an error signal;

a loop filter that filters the error signal to thereby produce the control signal;

an acquisition sweep circuit that is responsive to an activation signal to sweep the control signal and thereby acquire lock in the phase locked loop; and a variable attenuation circuit that is coupled between a phase locked loop input signal and the reference frequency input signal and that is also responsive to the activation signal, to attenuate the phase locked loop input signal after the sweep of the control signal.

2. A phase locked loop according to claim 1 wherein the variable attenuation circuit provides no attenuation to the phase locked loop input signal during the sweep of the control signal, and attenuates the phase locked loop input signal after the sweep of the control signal.

3. A phase locked loop according to claim 1 wherein the variable attenuation circuit also attenuates the phase locked loop input signal during the sweep of the control signal, by less than after the sweep of the control signal, to thereby decrease amplitude of the reference frequency input signal after the sweep of the control signal.

4. A phase locked loop according to claim 1 wherein the variable attenuation circuit provides a first attenuation to the phase locked loop input signal during the sweep of the control signal, and provides a second attenuation greater than the first attenuation to the phase locked loop input signal after the sweep of the control signal.

5. A phase locked loop according to claim 1 further comprising a pulse generating circuit that is responsive to the activation signal, to generate a pulse control signal in response to the activation signal; and wherein the variable attenuation circuit is responsive to the pulse control signal to attenuate the phase locked loop input signal after the sweep of the control input signal, and thereby decrease the amplitude of the reference frequency input signal after the sweep of the control signal.

6. A phase locked loop according to claim 1 wherein the variable attenuation circuit comprises a resonant tank notch circuit.

7. A phase locked loop according to claim 1 further comprising:

a frequency converter that is responsive to the output signal and to an offset frequency signal, the phase detector being responsive to the output frequency, offset by the offset signal frequency.

8. A phase locked loop comprising:

means for generating an output signal in response to a control signal;

means for producing an error signal in response to a reference frequency input signal and to the output signal;

means for filtering the error signal to thereby produce the control signal;

means for temporarily sweeping the control signal to acquire lock in the phase locked loop; and means for simultaneously temporarily increasing the amplitude of the reference frequency input signal, to thereby temporarily widen the bandwidth of the phase locked loop while temporarily sweeping the control signal.

9. A phase locked loop according to claim 8 wherein the means for simultaneously temporarily increasing the amplitude of the reference frequency input signal comprises:

means for attenuating a phase locked loop input signal after temporarily sweeping the control signal, to thereby decrease the amplitude of the reference frequency input signal after temporarily sweeping the control signal.

10. A phase locked loop according to claim 9 wherein the attenuating means further comprises means for attenuating the phase locked loop input signal while temporarily sweeping the control signal, by less than after temporarily sweeping the control signal, to thereby decrease the amplitude of the reference frequency input signal after temporarily sweeping the control signal.

11. A phase locked loop according to claim 9 wherein the attenuating means provides no attenuation to the phase locked loop input signal while temporarily sweeping the control signal, and attenuates the phase locked loop input signal after temporarily sweeping the control signal.

12. A phase locked loop according to claim 9 wherein the attenuating means provides a first attenuation to the phase locked loop input signal while temporarily sweeping the control signal, and provides a second attenuation greater than the first attenuation to the phase locked loop input signal after temporarily sweeping the control signal.

13. A phase locked loop according to claim 8 wherein the means for temporarily sweeping the control signal and the means for simultaneously temporarily increasing the amplitude of the reference frequency input signal are both responsive to an activation signal.

14. A method for acquiring lock in a phase locked loop comprising a controlled oscillator that is responsive to a control signal to generate an output signal, a phase detector that is responsive to a reference frequency input signal and to the output signal to produce an error signal, and a loop filter that filters the error signal to thereby produce the control signal, the lock acquiring method comprising the steps of:

temporarily sweeping the control signal; and simultaneously temporarily increasing the amplitude of the reference frequency input signal, to thereby temporarily widen the bandwidth of the phase locked loop while temporarily sweeping the control signal.

15. A method according to claim 14 wherein the step of simultaneously temporarily increasing the amplitude of the reference frequency input signal comprises the step of:

attenuating a phase locked loop input signal after temporarily sweeping the control signal, to thereby decrease the amplitude of the reference frequency input signal after temporarily sweeping the control signal.

16. A method according to claim 15 wherein the attenuating step comprises the steps of:

providing no attenuation to the phase locked loop input signal while temporarily sweeping the control signal; and attenuating the phase locked loop input signal after temporarily sweeping the control signal.

17. A method according to claim 15 wherein the attenuating step further comprises the step of attenuating the phase locked loop input signal while temporarily sweeping the control signal, by less than after temporarily sweeping the control signal, to thereby decrease the amplitude of the reference frequency input signal after temporarily sweeping the control signal.

18. A method according to claim 15 wherein the attenuating step comprises the steps of:

provided a first attenuation to the phase locked loop input signal while temporarily sweeping the control signal; and providing a second attenuation greater than the first attenuation to the phase locked loop input signal after temporarily sweeping the control signal.

19. A phase locked loop according to claim 14 wherein the step of temporarily sweeping the control signal and the step of simultaneously temporarily increasing the amplitude of the reference frequency input signal are both responsive to receipt of an activation signal.

* * * * *